(12) United States Patent
Kitamura et al.

(10) Patent No.: US 11,139,246 B2
(45) Date of Patent: Oct. 5, 2021

(54) SEMICONDUCTOR DEVICE WITH ALIGNED VIAS

(71) Applicant: TOSHIBA MEMORY CORPORATION, Tokyo (JP)

(72) Inventors: Masayuki Kitamura, Yokkaichi Mie (JP); Atsushi Kato, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,001

(22) Filed: Sep. 3, 2019

(65) Prior Publication Data

US 2020/0303308 A1 Sep. 24, 2020

(30) Foreign Application Priority Data

Mar. 18, 2019 (JP) .............................. JP2019-050354

(51) Int. Cl.
| | |
|---|---|
| *H01L 23/12* | (2006.01) |
| *H01L 23/48* | (2006.01) |
| *H01L 21/4763* | (2006.01) |
| *H01L 23/532* | (2006.01) |
| *H01L 23/522* | (2006.01) |
| *H01L 21/768* | (2006.01) |
| *H01L 21/48* | (2006.01) |

(Continued)

(52) U.S. Cl.
CPC ........ *H01L 23/5329* (2013.01); *H01L 21/486* (2013.01); *H01L 21/7682* (2013.01); *H01L 21/76802* (2013.01); *H01L 21/76807* (2013.01); *H01L 21/76843* (2013.01); *H01L 21/76883* (2013.01); *H01L 23/528* (2013.01); *H01L 23/5226* (2013.01); *H01L 23/53295* (2013.01); *H01L 27/11582* (2013.01)

(58) Field of Classification Search
CPC ............. H01L 21/76897; H01L 23/528; H01L 21/76807; H01L 21/76843; H01L 23/481; H01L 21/76877; H01L 21/76816; H01L 23/5329; H01L 23/5226; H01L 21/76802; H01L 21/76883; H01L 21/486; H01L 23/53295; H01L 21/7682
See application file for complete search history.

(56) References Cited

U.S. PATENT DOCUMENTS

| | | | |
|---|---|---|---|
| 6,545,361 B2* | 4/2003 | Ueda | ................. H01L 21/76801 257/758 |
| 6,737,357 B2* | 5/2004 | Shimizu | ............ H01L 21/76807 438/700 |

(Continued)

FOREIGN PATENT DOCUMENTS

| | | |
|---|---|---|
| JP | 2001-313334 A | 11/2001 |
| JP | 2008-021862 A | 1/2008 |

(Continued)

*Primary Examiner* — Alonzo Chambliss
(74) *Attorney, Agent, or Firm* — Foley & Lardner LLP

(57) ABSTRACT

According to one embodiment, a semiconductor device includes: a semiconductor substrate; a first via provided on the semiconductor substrate; a metal wiring provided on the first via; and a second via provided on the metal wiring. One of the side surfaces facing each other in the first direction of the metal wiring and one of the side surfaces facing each other in the first direction of the second via are aligned in the first direction.

18 Claims, 16 Drawing Sheets

(51) Int. Cl.
　　*H01L 23/528* (2006.01)
　　*H01L 27/11582* (2017.01)

(56) References Cited

U.S. PATENT DOCUMENTS

| | | | | |
|---|---|---|---|---|
| 6,888,247 | B2* | 5/2005 | Lee | H01L 21/76802 |
| | | | | 257/276 |
| 6,940,146 | B2* | 9/2005 | Lee | H01L 21/76802 |
| | | | | 257/522 |
| 9,312,222 | B2* | 4/2016 | Ting | H01L 21/76883 |
| 9,640,435 | B2* | 5/2017 | Ting | H01L 21/7684 |
| 9,704,760 | B2 | 7/2017 | Ok | |
| 10,170,420 | B2* | 1/2019 | Ting | H01L 23/5226 |
| 2003/0073257 | A1* | 4/2003 | Watanabe | H01L 21/76802 |
| | | | | 438/14 |
| 2004/0056359 | A1* | 3/2004 | Lee | H01L 21/76802 |
| | | | | 257/758 |
| 2004/0232552 | A1* | 11/2004 | Wang | H01L 21/7682 |
| | | | | 257/758 |
| 2008/0048339 | A1* | 2/2008 | Ahn | H01L 21/76807 |
| | | | | 257/774 |
| 2009/0065888 | A1* | 3/2009 | Kato | H01L 27/0629 |
| | | | | 257/476 |
| 2009/0302475 | A1* | 12/2009 | Korogi | H01L 23/53295 |
| | | | | 257/761 |
| 2010/0237402 | A1* | 9/2010 | Sekine | H01L 29/792 |
| | | | | 257/324 |
| 2013/0056816 | A1* | 3/2013 | Iwase | H01L 27/11582 |
| | | | | 257/316 |
| 2015/0364413 | A1* | 12/2015 | Peng | H01L 21/76879 |
| | | | | 257/774 |
| 2017/0236746 | A1* | 8/2017 | Yu | H01L 27/11582 |
| | | | | 257/314 |

FOREIGN PATENT DOCUMENTS

| | | |
|---|---|---|
| JP | 2009-111134 A | 5/2009 |
| JP | 2009-194286 A | 8/2009 |

* cited by examiner

SEMICONDUCTOR DEVICE WITH ALIGNED VIAS

CROSS-REFERENCE TO RELATED APPLICATION(S)

This application is based upon and claims the benefit of priority from Japanese Patent Application No. 2019-050354, filed Mar. 18, 2019, the entire contents of which are incorporated herein by reference.

FIELD

Embodiments described herein relate generally to a semiconductor device.

BACKGROUND

A manufacturing process of a semiconductor device includes a process of forming a via on a metal wiring. At this stage, when the position of the via on the metal wiring is misaligned, the distance between the metal wiring in which the via is formed and another metal wiring adjacent thereto is shortened. In this case, electrical short circuit failure may occur.

An example of related art includes JP-A-2001-313334.

DETAILED DESCRIPTION

Embodiments provide a semiconductor device capable of reducing electrical short circuit failure between a metal wiring and a via.

In general, according to one embodiment, a semiconductor device includes: a semiconductor substrate; a first via provided on the semiconductor substrate; a metal wiring provided on the first via; and a second via provided on the metal wiring. One of the side surfaces facing each other in the first direction of the metal wiring and one of the side surfaces facing each other in the first direction of the second via are aligned in the first direction.

Embodiments of the present disclosure will now be described with reference to the accompanying drawings. The embodiments do not limit the present disclosure.

First Embodiment

Figure 1A:
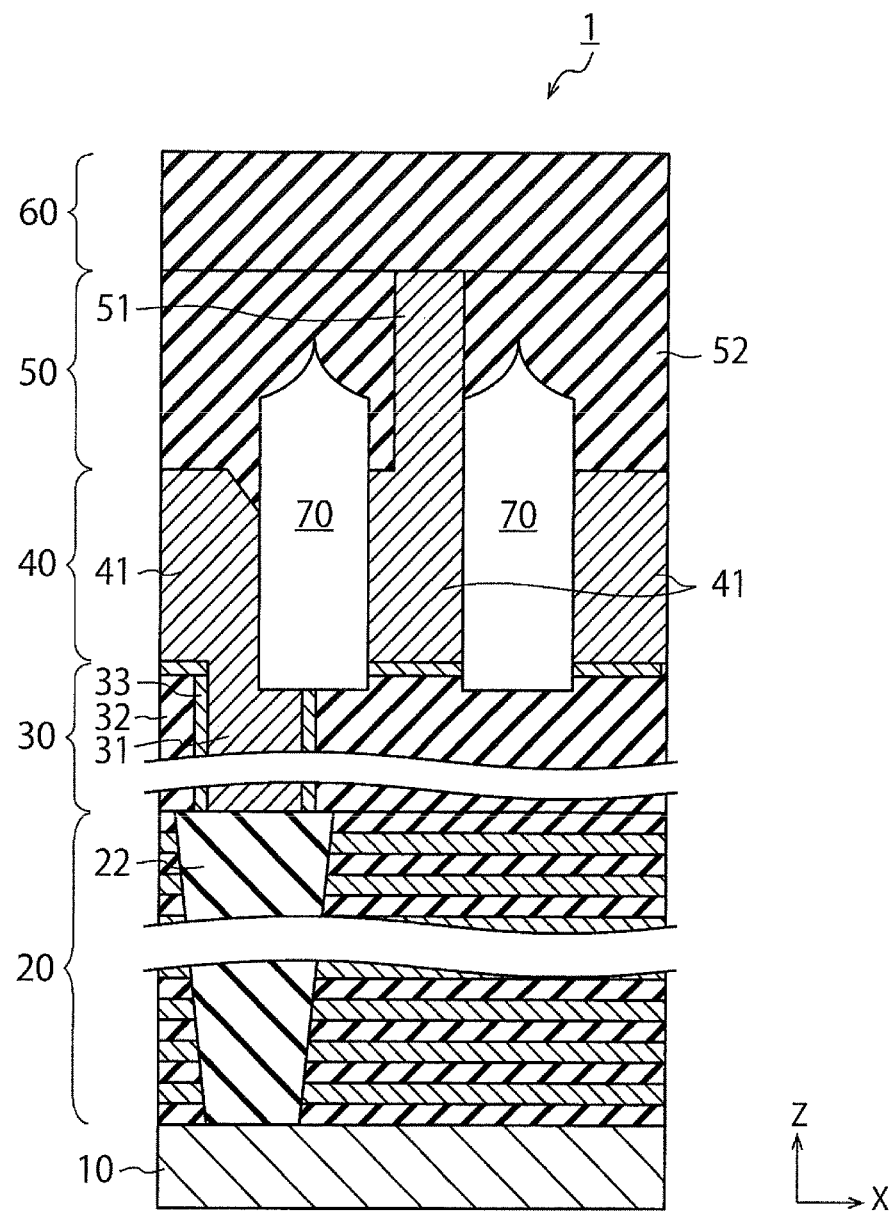
FIGS. 1A and 1B are a cross-sectional view and a plane view showing a schematic configuration of a semiconductor device according to a first embodiment.
Figure 1B:
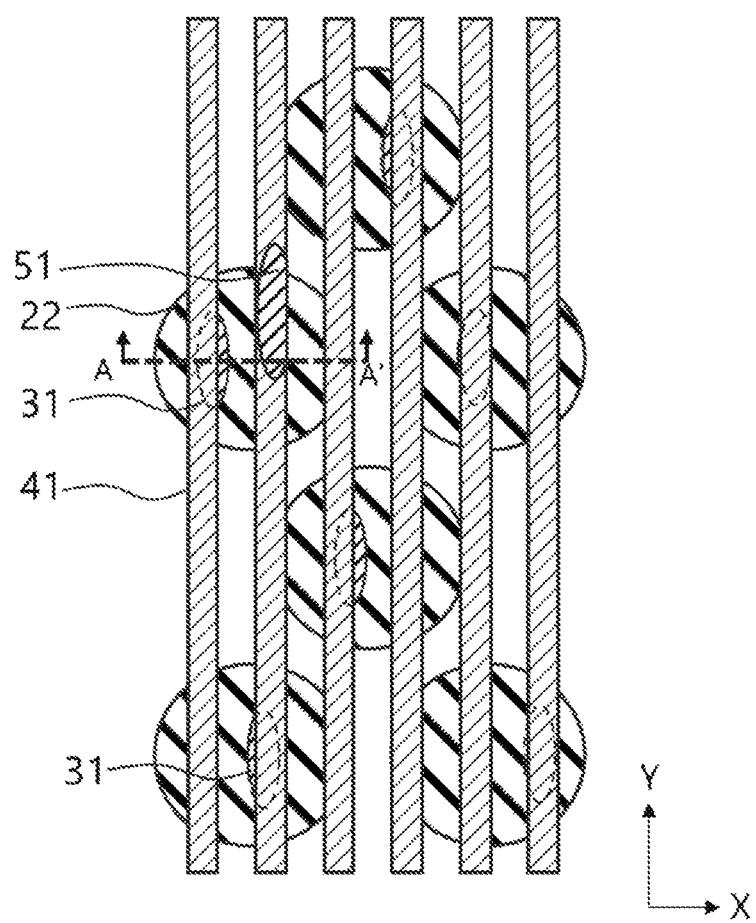

FIGS. 1A and 1B are a cross-sectional view and a plane view showing a schematic configuration of a semiconductor device according to a first embodiment. FIG. 1A is a cross-sectional view taken along line AA' in FIG. 1B. A semiconductor device 1 shown in FIG. 1 is a three-dimensional semiconductor memory in which memory cells are stacked. The semiconductor device 1 includes a semiconductor substrate 10, an element layer 20, a contact layer 30, a wiring layer 40, a via layer 50 and an insulating film 60.

The semiconductor substrate 10 is, for example, a silicon substrate. The element layer 20 is provided on the semiconductor substrate 10. Here, the structure of the element layer 20 will be described with reference to FIG. 2.

Figure 2:
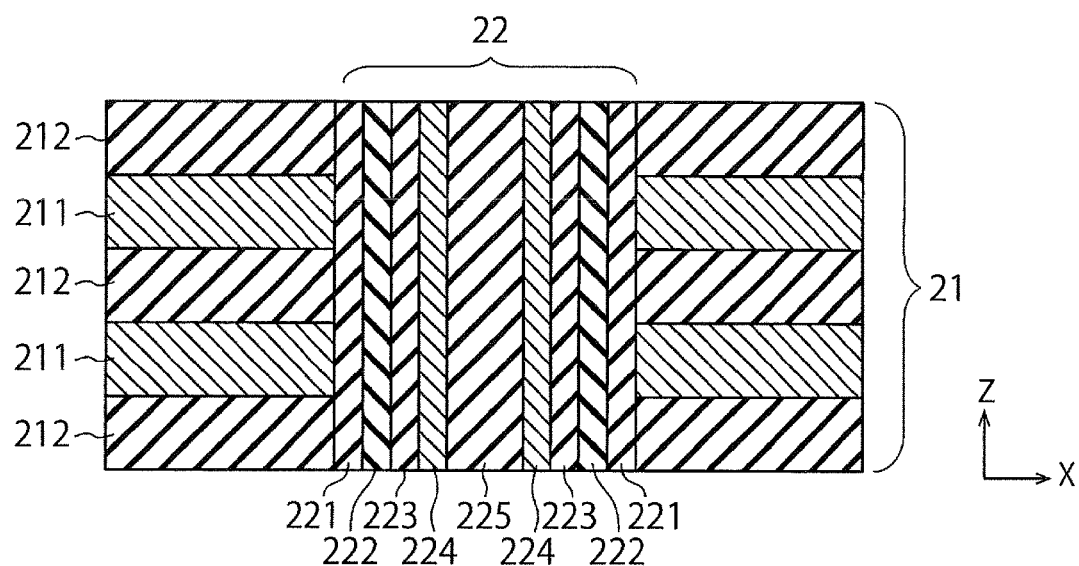
FIG. 2 is cross-sectional view showing an example of the structure of an element layer.

FIG. 2 is cross-sectional view showing an example of the structure of the element layer 20. The element layer 20 shown in FIG. 2 includes a stacked body 21 and a memory element film 22. In the stacked body 21, a plurality of electrode layers 211 and a plurality of insulating layers 212 are alternately stacked. Each electrode layer 211 is, for example, a tungsten layer (W), and functions as a word line electrically connected to the memory element film 22. On the other hand, each insulating layer 212 is, for example, a silicon oxide layer ($SiO_2$).

The memory element film 22 is formed in a hole penetrating through the stacked body 21 in the Z direction. A charge block film 221 is formed on the outer periphery of the hole. A charge storage film 222 is formed inside the charge block film 221. A tunnel insulating film 223 is formed inside the charge storage film 222. A channel film 224 is formed inside the tunnel insulating film 223. A core film 225 is formed inside the channel film 224.

The charge block film 221, the tunnel insulating film 223 and the core film 225 are, for example, silicon oxide films. The charge storage film 222 is, for example, a silicon nitride film (SiN). The channel film 224 is, for example, a polysilicon film.

As shown in FIG. 1A, the contact layer 30 is provided on the element layer 20. In the contact layer 30, a contact 31 (first via) penetrates an insulating film 32. The contact 31 is electrically connected to the channel film 224 of the memory element film 22 described above. Further, a barrier metal 33 is formed between the contact 31 and the insulating film 32. It is noted that another contact may be provided between the contact 31 and the channel film 224 for electrical connection.

The material of the contact 31 is, for example, tungsten. The insulating film 32 is, for example, a silicon oxide film. The material of the barrier metal 33 is, for example, titanium nitride (TiN).

The wiring layer 40 is provided on the contact layer 30. In the wiring layer 40, a plurality of metal wirings 41 extending in the Y direction are formed at equal intervals in the X direction. One of the plurality of metal wirings 41 is electrically connected to the contact 31. Although FIG. 1 shows that the contact 31 is connected to be in contact with the left end metal wiring 41, each of the central and right end metal wirings 41 is also connected to another memory element film, in the Y direction through another contact, as shown in FIG. 1B. That is, each metal wiring 41 is electrically connected to a pluralities of memory element film 22, through a pluralities of contact 31 in the Y direction. The metal wiring 41 is formed of the same metal material as that of the contact 31, for example, tungsten. It is noted that although three metal wirings 41 are shown in FIG. 1, the number of metal wirings 41 is not particularly limited.

The via layer 50 is formed on the wiring layer 40. In the via layer 50, a part of the side surface of a via 51 (second via) is covered with an insulating film 52. The via 51 is electrically connected to one of the plurality of metal wirings 41. That is, at least one via 51 is provided on each of metal wirings. Although FIG. 1 shows that the via 51 is formed on the central metal wiring 41, each of the left end and right end metal wirings 41 is connected to another via, not shown, in the Y direction. The via 51 is formed of the same metal material as that of the contact 31 and the metal wiring 41, for example, tungsten. The insulating film 52 is, for example, a silicon oxide film. It is noted that the material of the contact 31, the metal wiring 41 and the via 51 is not limited to tungsten, and may be another conductive material such as copper or aluminum, or each may be a different material. Also, the contact 31, the wiring 41 and the via 51 may be formed at the same position in the Z direction.

The insulating film 60 is formed on the via layer 50. The insulating film 60 is, for example, a silicon oxide film. By the insulating film 60, an air gap 70 is formed under the wiring layer 40 and the via layer 50. The metal wirings 41 are separated by the air gap 70. The bottom (lower end) of the air gap 70 reaches, for example, the contact layer 30. As a result, a part of the contact 31 is partially removed to be in a notch form. It is noted that another conductive member may be formed in the insulating film 60 and electrically connected to the via 51.

Hereinafter, a method of manufacturing the above-described semiconductor device 1 will be described. Here, a manufacturing process of the contact layer 30, the wiring layer 40 and the via layer 50 will be described.

Figure 3:
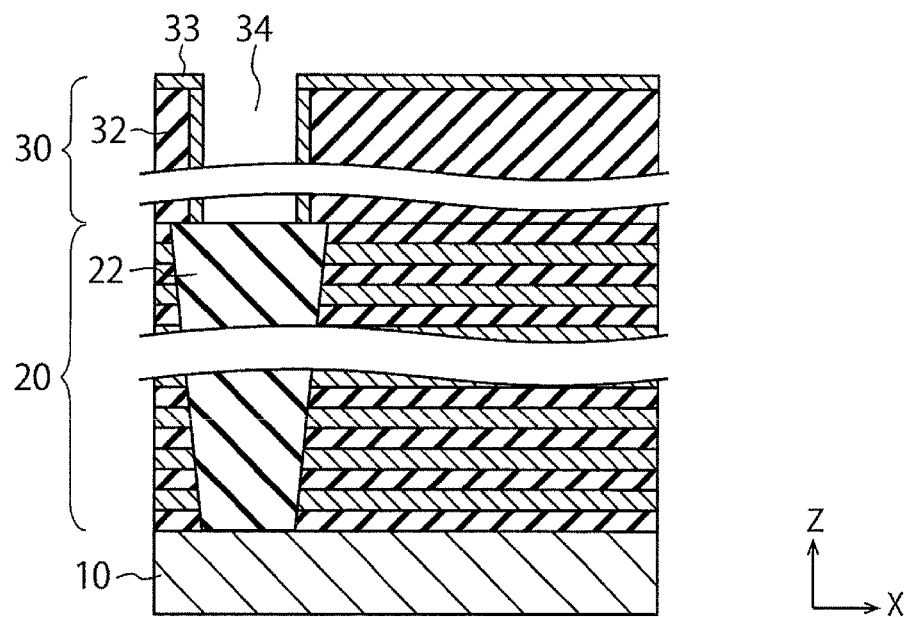
FIG. 3 is a cross-sectional view illustrating a process of forming a hole and a barrier metal.

First, as shown in FIG. 3, a hole 34 is formed in the insulating film 32 of the contact layer 30, and a barrier metal 33 is formed on the inner peripheral surface of the hole 34 and the upper surface of the insulating film 32. The hole 34 is formed on the memory element film 22.

Figure 4:
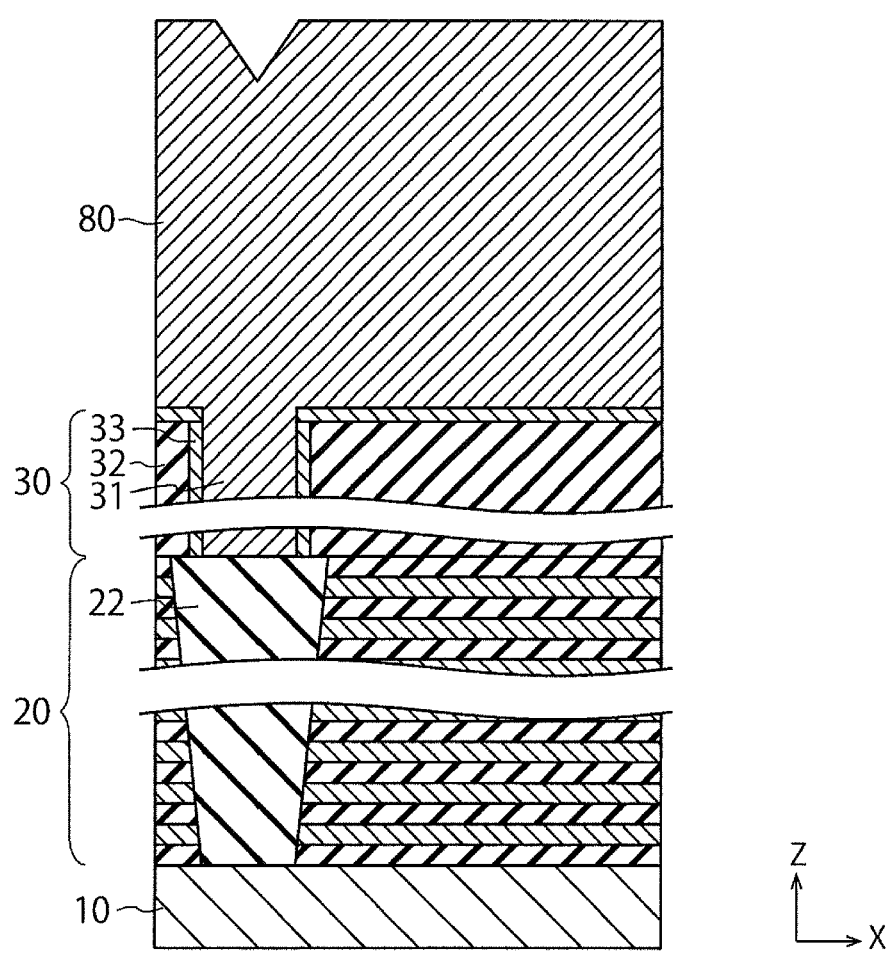
FIG. 4 is a cross-sectional view illustrating a process of forming a metal film.

Next, as shown in FIG. 4, a metal film 80 is buried in the hole 34, and formed over the entire upper surface of the insulating film 32. A portion of the metal film 80 buried in the hole 34 corresponds to the contact 31. Further, a portion of the metal film 80 formed on the upper surface of the insulating film 32 is to form the metal wiring 41 and the via 51, which shall be described below.

Figure 5:
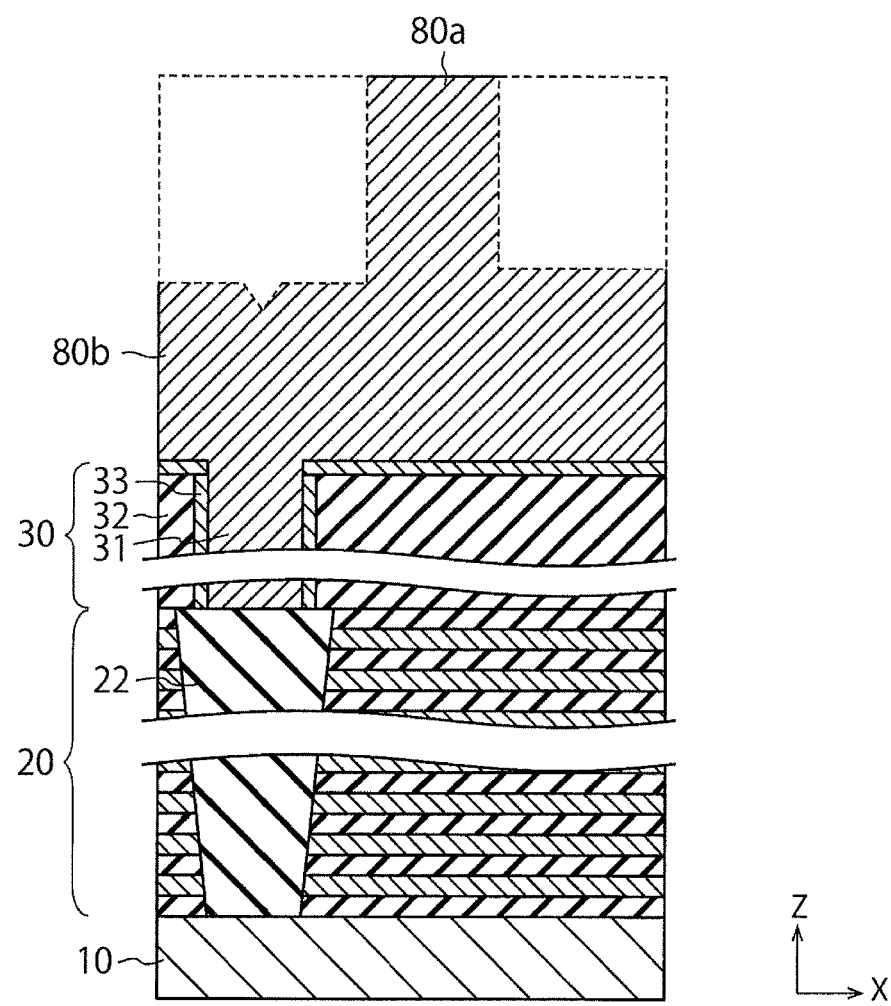
FIG. 5 is a cross-sectional view illustrating a process of etching a part of the upper half of the metal film.

Next, as shown in FIG. 5, a part of the upper portion of the metal film 80 is etched. The etching pattern is formed, for example, by lithography. At this stage, a remaining portion 80a of the upper portion is processed to form the via 51, and a portion 80b not etched is processed to form the metal wiring 41. A remaining portion 80a is, for example, a hole shape pattern.

Figure 6:
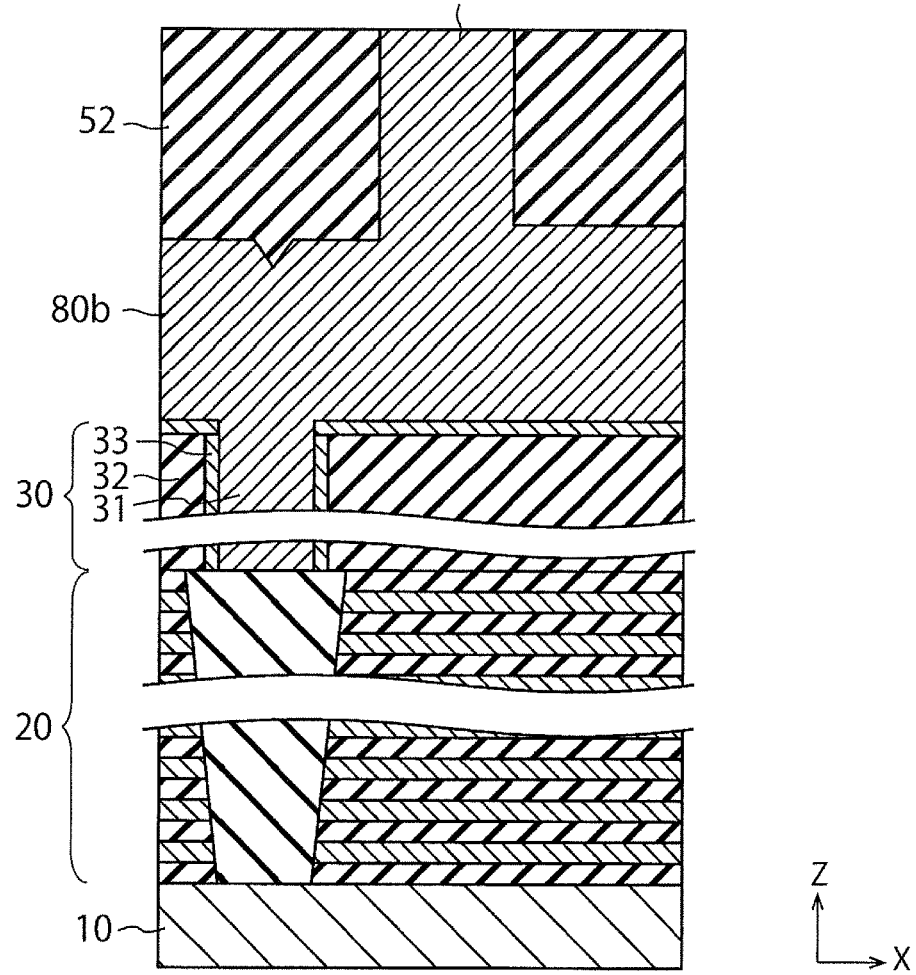
FIG. 6 is a cross-sectional view illustrating a process of forming an insulating film.

Next, as shown in FIG. 6, the insulating film 52 is formed on the upper surface of the portion 80b and the side surface of the portion 80a. The insulating film 52 is formed so as to entirely cover the portions 80b and 80a, and then, processed to form the shape shown in FIG. 5 by a polishing process.

Figure 7:
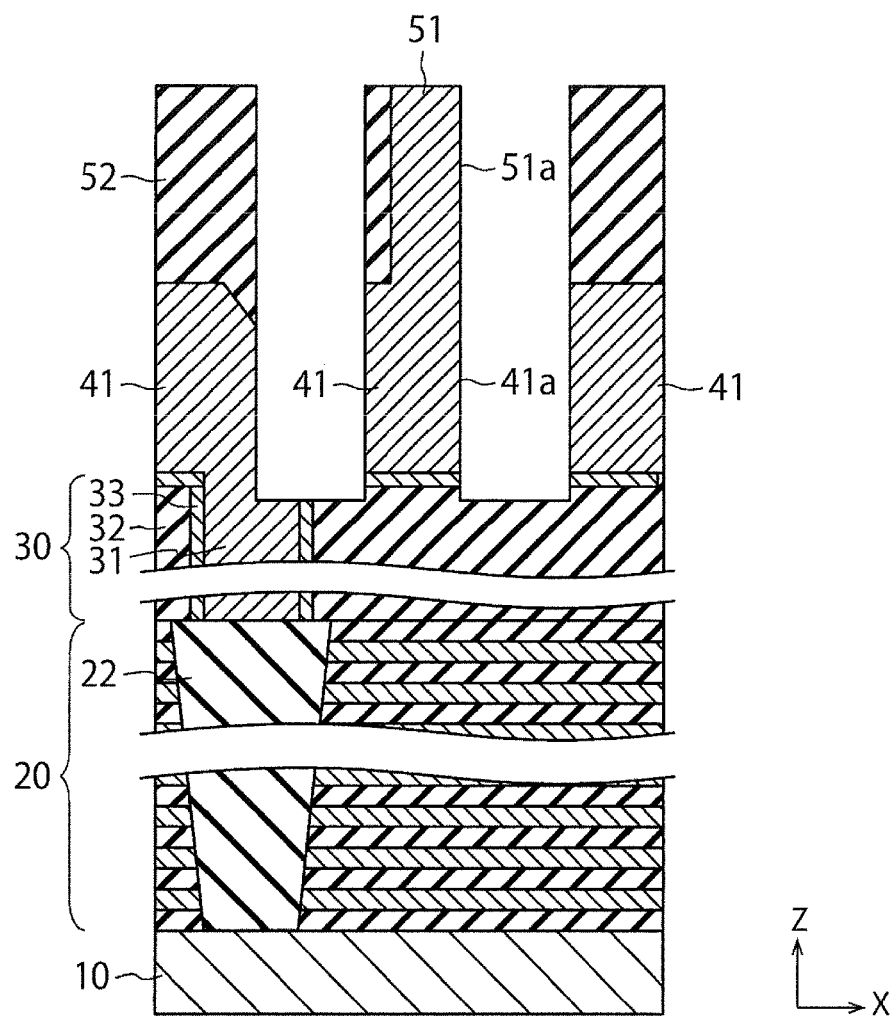
FIG. 7 is a cross-sectional view illustrating a process of etching the metal film and the insulating film.

Next, as shown in FIG. 7, the portion 80b and the insulating film 52 are etched along a desired metal wiring 41 pattern by, for example, RIE (Reactive Ion Etching). Thus, the portion 80b is processed to form the metal wiring 41, and the portion 80a is processed to form the via 51.

In the etching process shown in FIG. 7, the metal wiring 41 and the via 51 are simultaneously processed. Therefore, even if the position of the portion 80a of the metal film 80 is misaligned in the X direction (first direction) with respect to the design position, the misaligned portion is etched simultaneously with the portion 80b. As a result, the boundary between the side surface 51a of the via 51 and the side surface 41a of the metal wiring does not have a level difference and is flat. In other words, one of the side surfaces opposite to each other in the X direction of the metal wiring 41 and one of the side surfaces opposite to each other in the X direction of the via 51 are aligned along the Z direction. Therefore, in FIG. 7, a sufficient distance is ensured between the via 51 and another metal wiring 41 adjacent in the X direction to the metal wiring 41 electrically connected to the via 51.

Further, the etching is stopped when the upper end of the contact 31 is partially etched. As a result, the upper end portion of the contact 31 has a notch shape, so that a sufficient distance can be ensured between the contact 31 and the metal wiring 41 adjacent to the metal wiring 41 connected to the contact 31, and electrical short circuit failure can be reduced.

Thereafter, as shown in FIG. 1, the insulating film 60 is formed. At this stage, the insulating film 60 terminates at the upper portion of the via layer 50. Therefore, an air gap 70 is formed in the lower part of the via layer 50, and in the gap between the metal wirings 41 in the wiring layer 40.

According to the embodiment described above, by simultaneously processing the metal wiring 41 and the via 51, a sufficient distance can be ensured between the via 51 and another metal wiring 41 adjacent in the X direction to the metal wiring 41 electrically connected to the via 51. Therefore, it is possible to reduce electrical short circuit failure.

Second Embodiment

Figure 8:
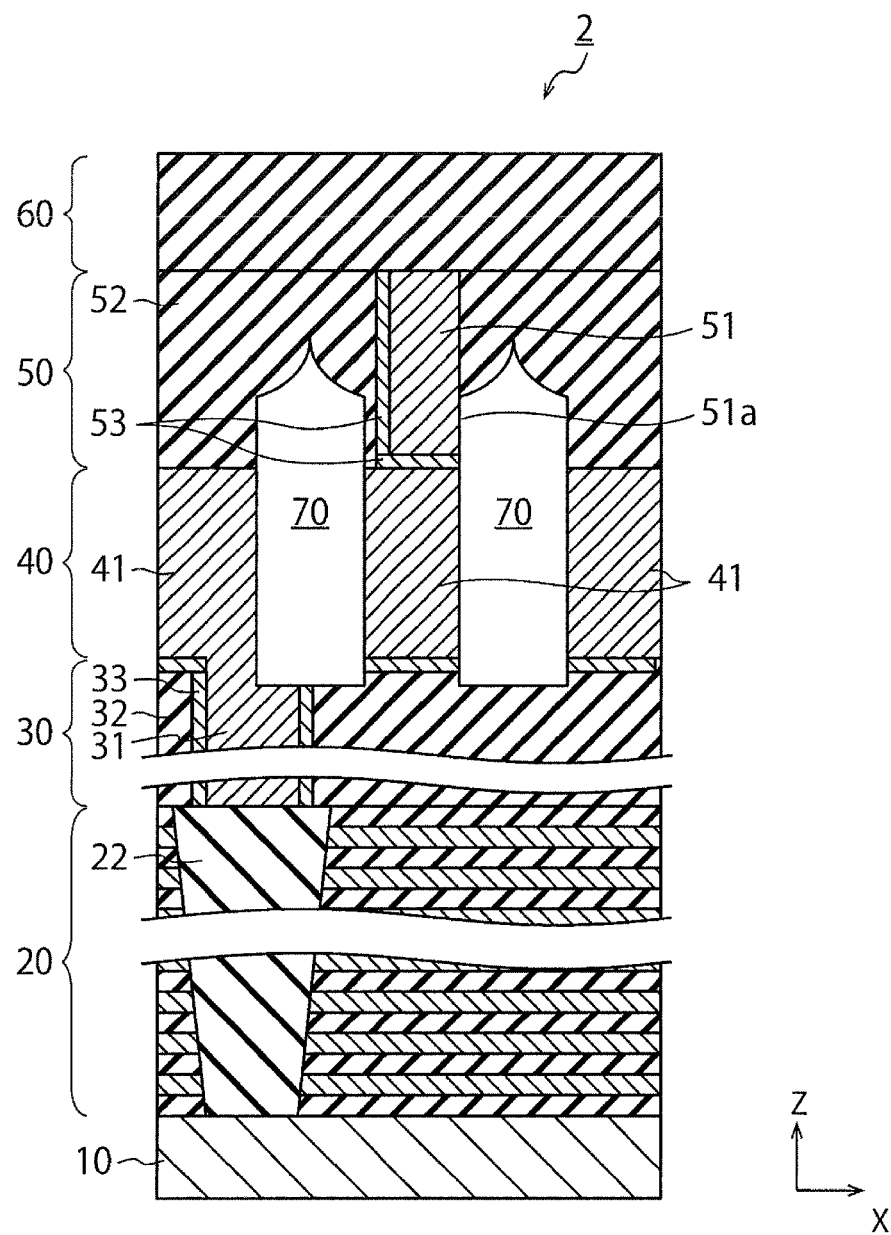
FIG. 8 is a cross-sectional view showing a schematic configuration of a semiconductor device according to a second embodiment.

FIG. 8 is a cross-sectional view showing a schematic configuration of a semiconductor device according to a second embodiment. The components similar to those of the semiconductor device 1 according to the first embodiment shown in FIG. 1 are denoted by the same reference numerals, and detailed description thereof will be omitted.

In a semiconductor device 2 shown in FIG. 8, a barrier metal 53 is formed on the bottom surface and the side surface opposite to the side surface 51a of the via 51 in the X direction. In other words, the barrier metal 53 having an L-shaped cross section is formed in the via 51. The material of the barrier metal 53 is the same as that of the barrier metal 33, for example, titanium nitride. In the second embodiment, the materials of the metal wiring 41 and the via 51 may be the same or different.

Hereinafter, a method of manufacturing the above-described semiconductor device 2 will be described. Here, a manufacturing process of the wiring layer 40 and the via layer 50 will be described.

Figure 9:
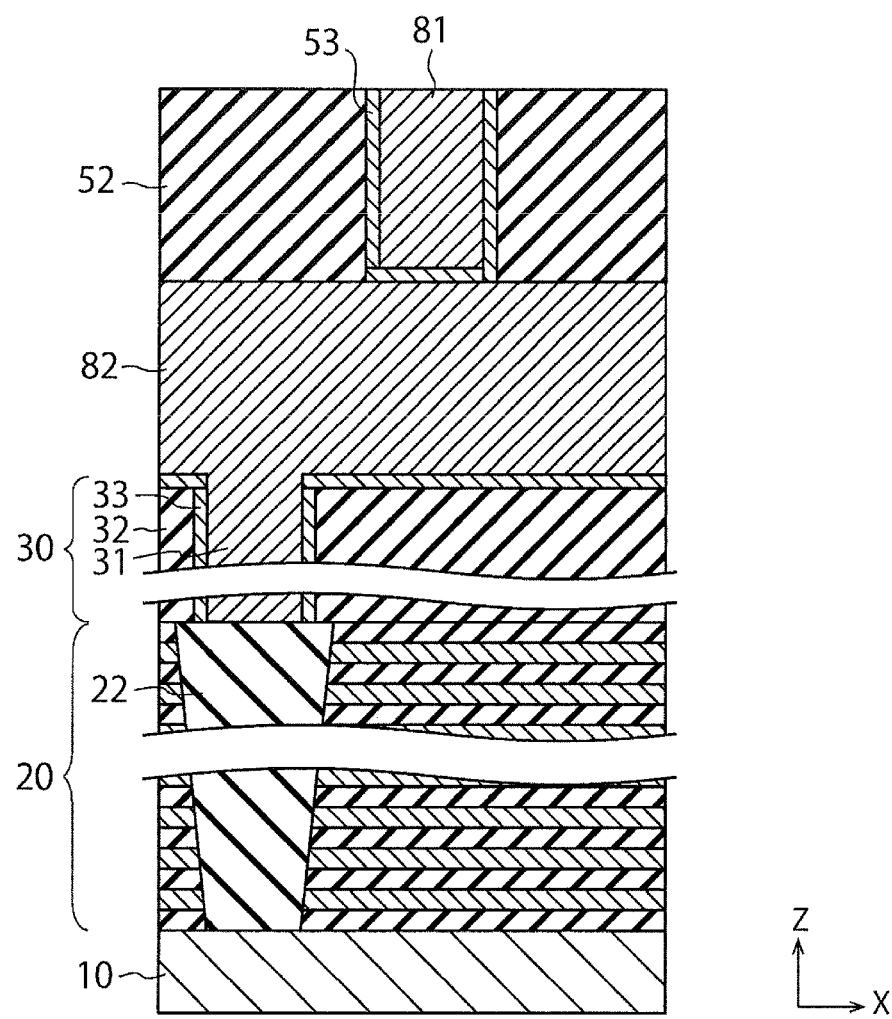
FIG. 9 is a cross-sectional view illustrating a process of forming a barrier metal and a metal film in the second embodiment.

First, as shown in FIG. 9, the barrier metal 53 and a metal film 81 are formed on the insulating film 52. The barrier metal 53 is formed on the inner peripheral portion of a via penetrating the insulating film 52. On the other hand, the metal film 81 is embedded in the via after the barrier metal 53 is formed. The metal film 81 is a film to form the via 51. It is noted that the insulating film 52 is formed on a metal film 82. The metal film 82 is a film to form the metal wiring 41.

Figure 10:
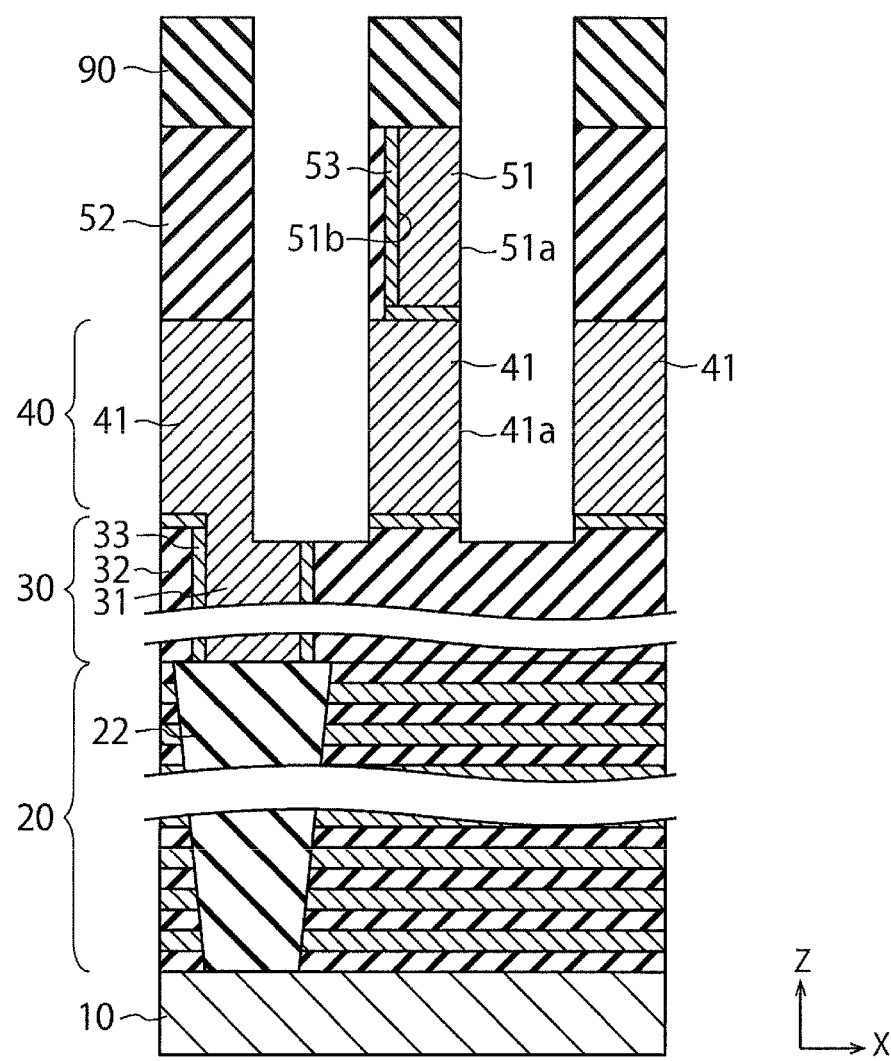
FIG. 10 is a cross-sectional view illustrating a process of etching an insulating film and the metal film in the second embodiment.

Next, as shown in FIG. 10, the insulating film 52, the metal film 81 and the metal film 82 are etched by RIE. In this etching process, a mask 90 corresponding to the pattern of the metal wiring 41 is formed on the via 51 and the insulating film 52. As a result, the metal film 81 is formed in the via 51, and the metal film 82 is processed to form a plurality of metal wirings 41. The mask 90 is, for example, a carbon film, and is removed after each metal wiring 41 is formed.

In the etching process shown in FIG. 10, even if the position of the metal film 81 is misaligned in the X direction with respect to the design position, the misaligned portion is etched simultaneously with the insulating film 52. As a result, as in the first embodiment, the boundary between the side surface 51a of the via 51 and the side surface 41a of the metal wiring does not have a level difference and is flat.

Thereafter, as shown in FIG. 8, the insulating film 60 is formed in the same manner as in the first embodiment. Therefore, an air gap 70 is formed in the lower part of the via layer 50, and in the gap between the metal wirings 41 in the wiring layer 40.

According to the embodiment described above, by forming in advance the metal film 81 to form the via 51 on the metal film 82 to form the metal wiring 41, a sufficient distance can be ensured between the via 51 and another metal wiring 41. Therefore, it is possible to reduce electrical short circuit failure.

Third Embodiment

Figure 11:
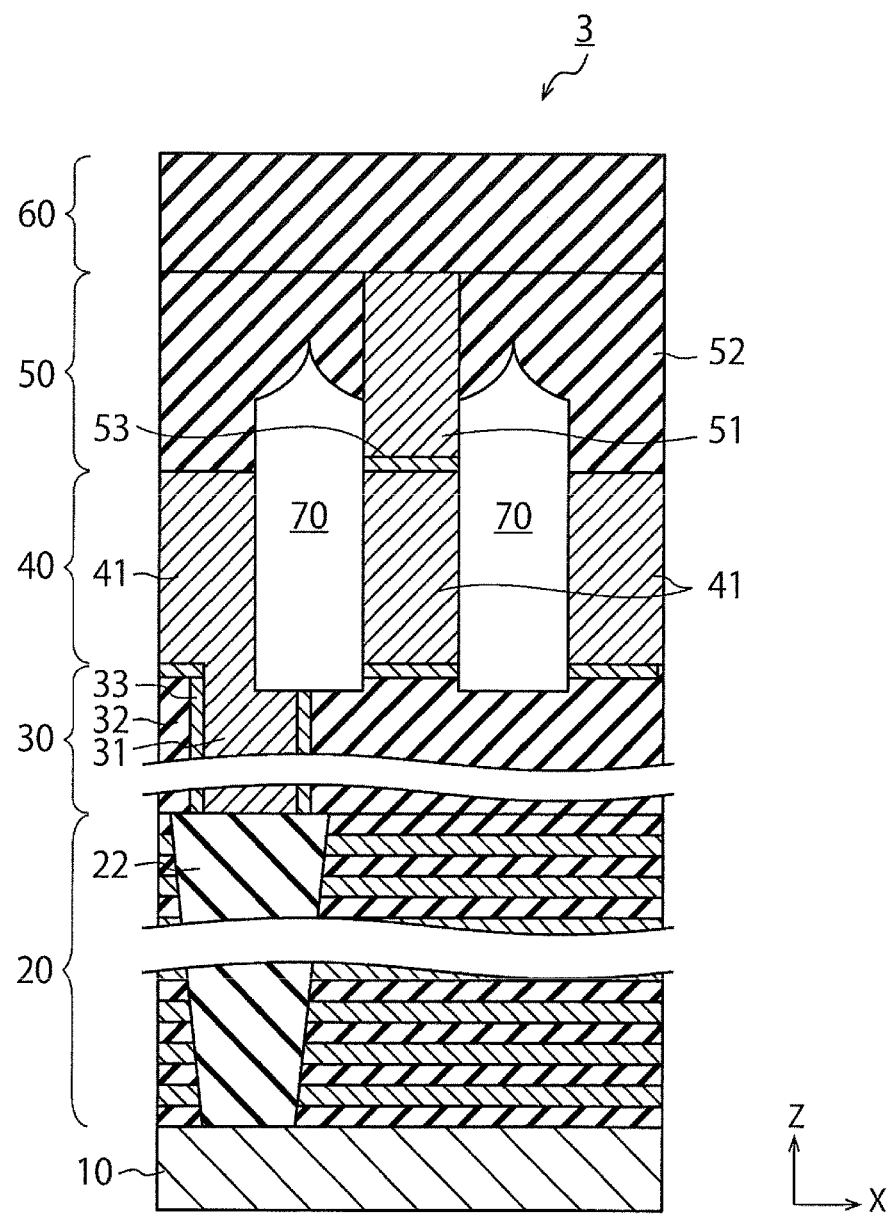
FIG. 11 is a cross-sectional view showing a schematic configuration of a semiconductor device according to a third embodiment.

FIG. 11 is a cross-sectional view showing a schematic configuration of a semiconductor device according to a third embodiment. The components similar to those of the semiconductor device 2 according to the second embodiment shown in FIG. 8 are denoted by the same reference numerals, and detailed description thereof will be omitted.

In a semiconductor device 3 shown in FIG. 11, a barrier metal 53 described in the second embodiment is formed on the bottom surface of the via 51. In other words, the barrier metal 53 is formed at the boundary with the metal wiring 41. In the third embodiment, the materials of the metal wiring 41 and the via 51 may be the same or different.

Hereinafter, a method of manufacturing the above-described semiconductor device 3 will be described. Here, a manufacturing process of the wiring layer 40 and the via layer 50 will be described.

Figure 12:
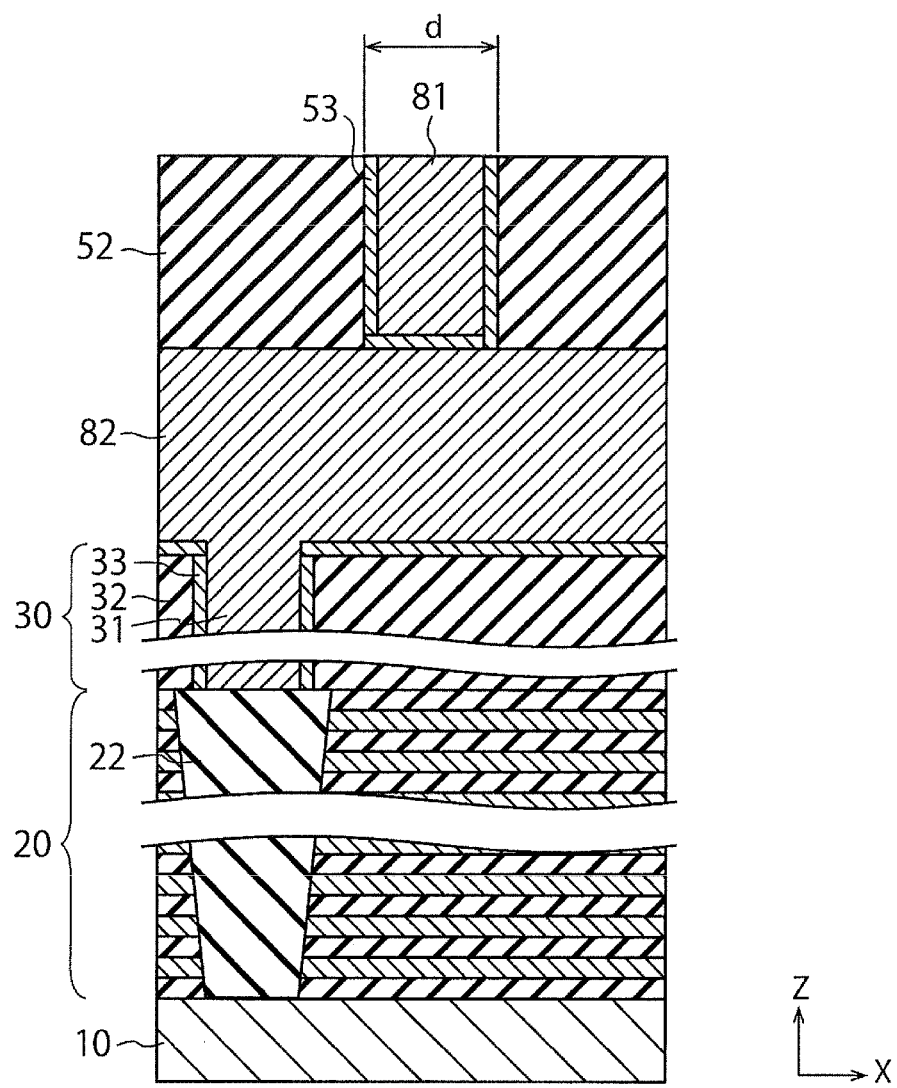
FIG. 12 is a cross-sectional view illustrating a process of forming a barrier metal and a metal film in the third embodiment.

First, as shown in FIG. 12, the barrier metal 53 and the metal film 81 are formed on the insulating film 52 by the same method as that of the second embodiment. However, in the embodiment, the diameter d of the via in which the metal film 81 is embedded is wider than that in the second embodiment. Specifically, the diameter d may be expanded to twice or less the width of the metal wiring 41 in the X direction.

Figure 13:
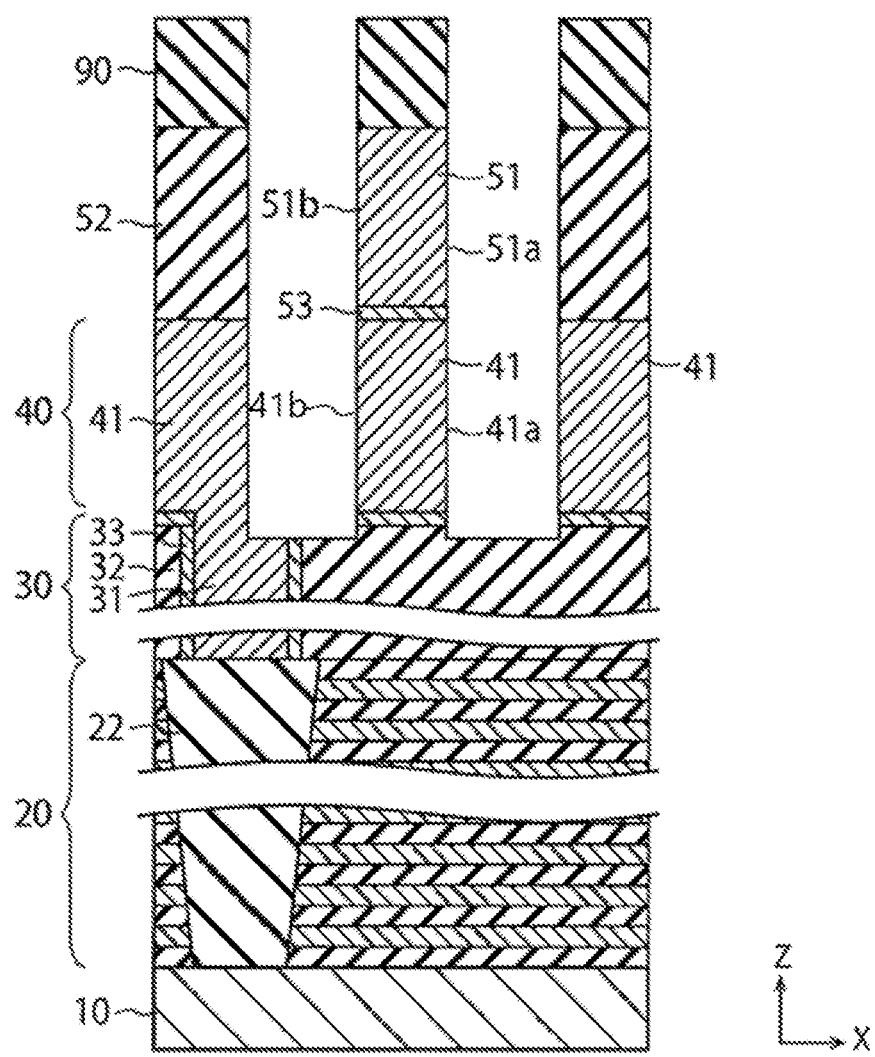
FIG. 13 is a cross-sectional view illustrating a process of etching an insulating film, the barrier metal and the metal film in the third embodiment.

Next, as shown in FIG. 13, the insulating film 52, the metal film 81, the barrier metal 53 formed on the side surface of the metal film 81, and the metal film 82 are etched by RIE. In the etching process, the mask 90 is used as in the second embodiment. As a result, the metal film 81 is formed in the via 51, and the metal film 82 is processed to form a plurality of metal wirings 41.

For example, in the method of forming the via 51 after forming the metal wiring 41, in order to ensure a sufficient distance between the via 51 and another metal wiring 41 formed next to the metal wiring 41 connected to the via 51, the via diameter d should be minimized.

On the other hand, according to the embodiment, the via 51 outside the metal wiring 41 is removed when the metal film 81 is processed. That is, even if the diameter d of the via is expanded to such an extent that it does not contact another metal wiring 41, the excess metal film 81 is removed by RIE at the time of formation of the wiring layer 40. Thus, in the via 51 and the metal wiring 41, in addition to the boundary between the side surface 51a and the side surface 41a, the boundary between the side surface 51b opposite to the side surface 51a in the X direction and the side surface 41b opposite to the side surface 41a in the X direction does not have a level difference and is flat. As a result, a sufficient distance is ensured between the via 51 and another metal wiring 41, so that electrical short circuit failure can be reduced.

In addition, if the diameter d of the via can be expanded, the aspect ratio which is the ratio of the diameter d to the depth is reduced, so that productivity improvement in the RIE process, and lithography cost reduction due to expansion of the formed pattern can be achieved.

It is noted that in the second and third embodiments described above, the barrier metal 53 may contain the same metal material as that of the metal wiring 41 and the via 51. When the metal material is tungsten, the barrier metal 53 is, for example, tungsten nitride.

Fourth Embodiment

Figure 14:
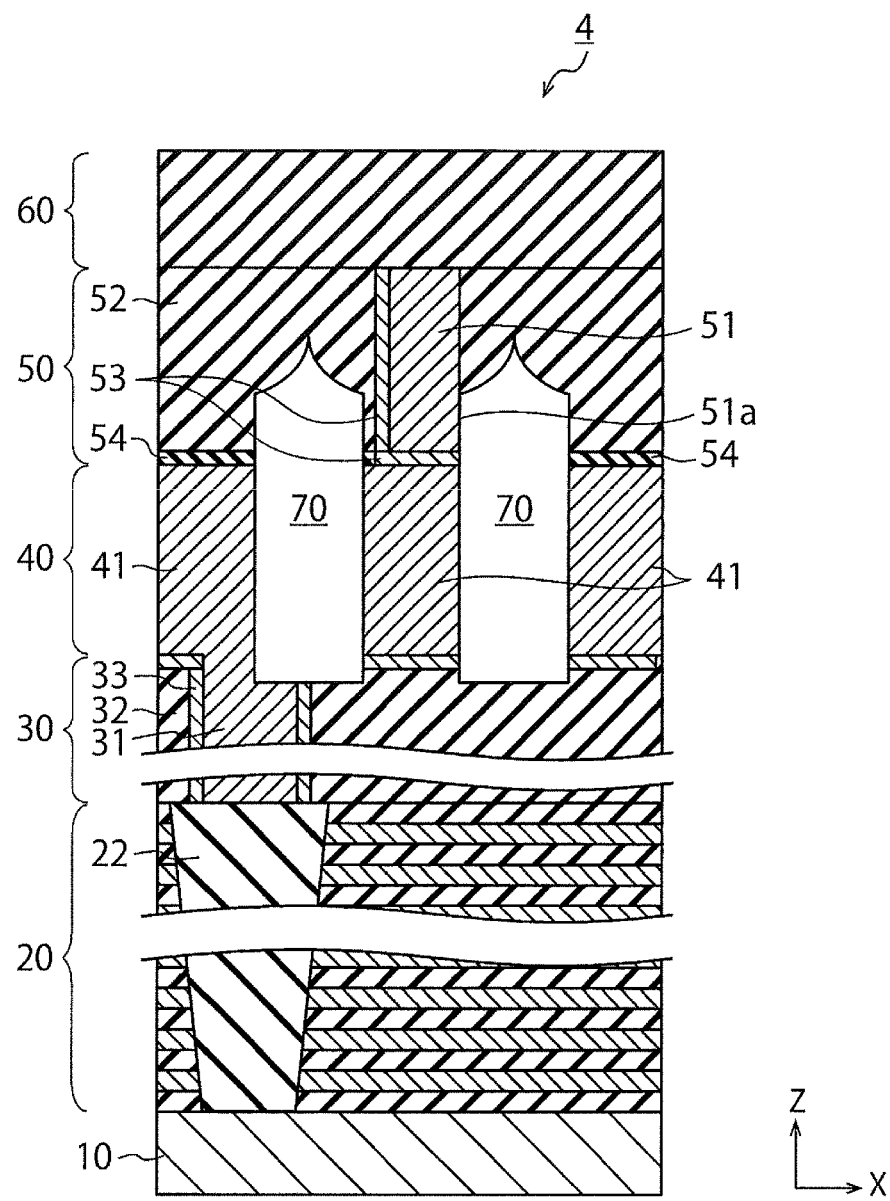
FIG. 14 is a cross-sectional view showing a schematic configuration of a semiconductor device according to a fourth embodiment.

FIG. 14 is a cross-sectional view showing a schematic configuration of a semiconductor device according to a fourth embodiment. The components similar to those of the semiconductor device 2 according to the second embodiment shown in FIG. 8 are denoted by the same reference numerals, and detailed description thereof will be omitted.

In the via layer 50 of a semiconductor device 4 shown in FIG. 14, an insulating film 54 is formed under the insulating film 52. That is, the insulating film of the via layer 50 is formed of a plurality of layers having different compositions. The insulating film 54 is, for example, a silicon nitride film. In the fourth embodiment, the materials of the metal wiring 41 and the via 51 may be the same or different.

Figure 15:
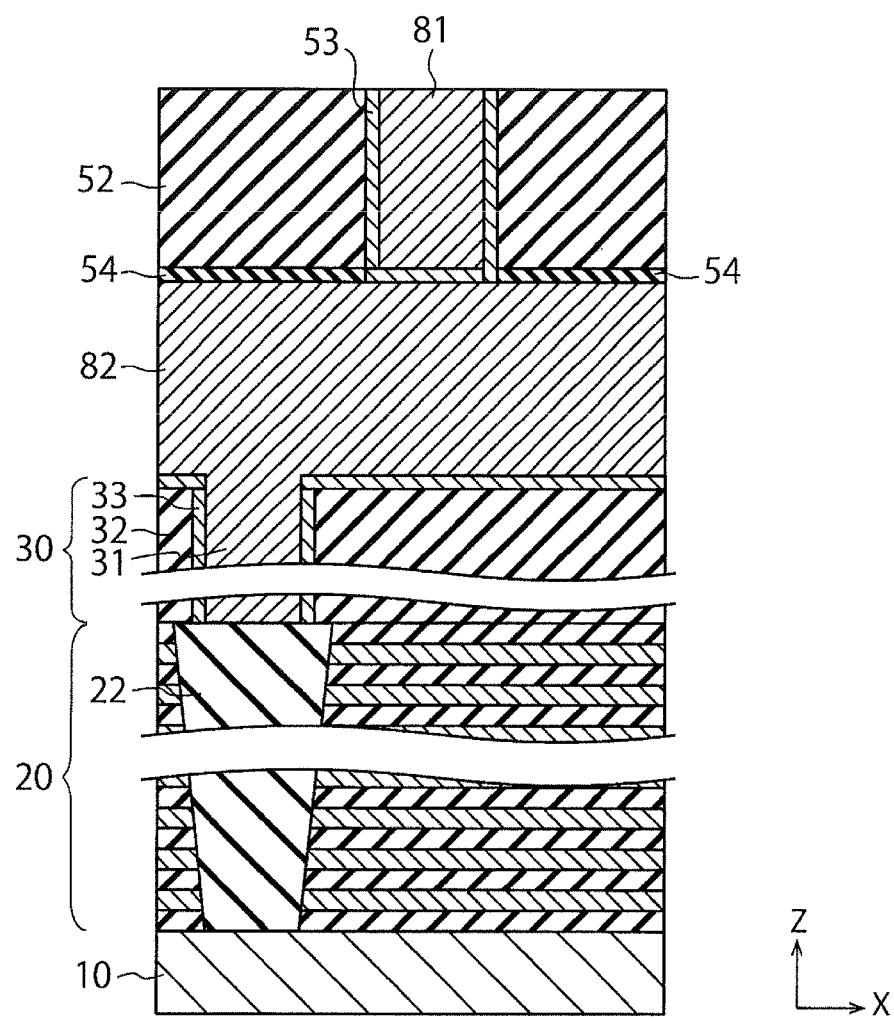
FIG. 15 is a cross-sectional view showing a part of the manufacturing process of the semiconductor device according to the fourth embodiment.

FIG. 15 is a cross-sectional view showing a part of a manufacturing process of the semiconductor device 4. In FIG. 15, after the insulating film 54 and the insulating film 52 are sequentially formed on the metal film 82, the barrier metal 53 and the metal film 81 are formed.

Next, as described in the second embodiment or the third embodiment, the wiring layer 40 and the via layer 50 are simultaneously processed by etching using the mask 90. At this stage, the insulating film 54 allows different processing conditions to be used for the via layer 50 and the wiring layer 40, thus, the processing shape can be improved.

In the RIE process of the via layer 50, since the insulating film 52 and the metal film 81 need to be processed simultaneously, it is required to perform etching so that their etching ratios are as equal as possible. On the other hand, since only the metal film 82 is required to be etched in the RIE process of the wiring layer 40, it is assumed that the processing condition is different from that of the via layer 50.

Therefore, as in the embodiment, if the insulating film of the via layer 50 has a two-layer structure including the insulating film 54 which is a silicon nitride film and the insulating film 52 which is a silicon oxide film, for example, it is possible to use the silicon nitride film as a stopper at the time of silicon oxide film processing. This can improve the processing shape.

Fifth Embodiment

Figure 16:
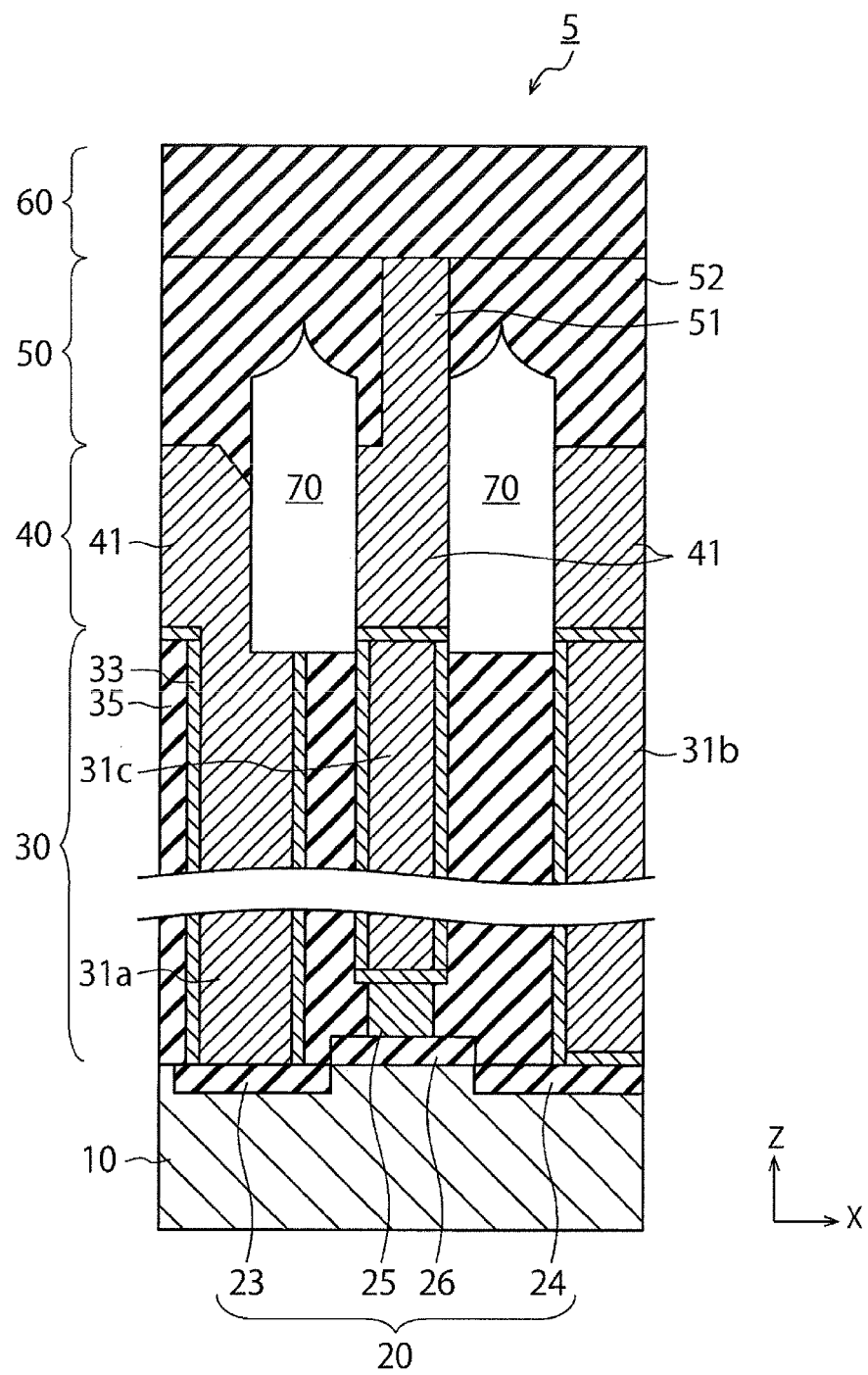
FIG. 16 is a cross-sectional view showing a schematic configuration of a semiconductor device according to a fifth embodiment.

FIG. 16 is a cross-sectional view showing a schematic configuration of a semiconductor device according to a fifth embodiment. The components similar to those of the semiconductor device 1 according to the first embodiment shown in FIG. 1 described above are denoted by the same reference numerals, and detailed description thereof will be omitted.

In the first to fourth embodiments described above, a memory element is provided in the element layer 20. On the other hand, in the element layer 20 of a semiconductor device 5 according to the embodiment, a switching element such as a MIS (Metal Insulator Semiconductor) transistor is provided.

The element layer 20 shown in FIG. 16 includes a first diffusion layer 23, a second diffusion layer 24, a gate electrode 25 and a gate insulating film 26. One of the first diffusion layer 23 and the second diffusion layer 24 serves as a drain region, and the other serves as a source region. The first diffusion layer 23 is connected to a contact 31*a*, and the second diffusion layer 24 is connected to a contact 31*b*. The gate electrode 25 is connected to a contact 31*c*. The gate insulating film 26 is provided between the gate electrode 25 and each diffusion layer. Each of the outer surfaces of the contacts 31*a*, 31*b* and 31*c* is covered with a barrier metal 33, and each of the contacts is insulated by an insulating film 35.

Also in the semiconductor device 5 according to the embodiment, the wiring layer 40 and the via layer 50 are formed by the same manufacturing method as that of any of the above-described first to fourth embodiments. Therefore, a sufficient distance is ensured between the via 51 and another metal wiring 41 adjacent in the X direction to the metal wiring 41 electrically connected to the via 51. Therefore, it is possible to reduce electrical short circuit failure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first via provided in an insulating layer;
   a first metal wiring provided on the first via;
   a second metal wiring spaced apart from the first metal wiring by an air gap; and
   a second via provided on the first metal wiring,
   wherein a first side surface of the first metal wiring and a first side surface of the second via are aligned along a first direction, and
   wherein an upper surface of the first via includes a notch.

2. The semiconductor device according to claim 1, wherein a barrier metal is provided between the second via and the first metal wiring.

3. The semiconductor device according to claim 2, wherein the barrier metal is provided on a second side surface of the second via.

4. The semiconductor device according to claim 1, wherein the first via, the first metal wiring and the second via include an identical metal material.

5. The semiconductor device according to claim 1, wherein a second side surface of the first metal wiring and a second side surface of the second via are aligned along the first direction.

6. The semiconductor device according to claim 1, further comprising one or more other metal wirings, the one or more metal wirings and the first metal wiring spaced from each other at an equal interval in the second direction.

7. The semiconductor device according to claim 1, wherein the first via is electrically connected to a memory element film penetrating a stacked body in which an electrode layer and an insulating layer are alternately stacked on the semiconductor substrate.

8. The semiconductor device according to claim 1, wherein the first via is electrically connected to a transistor formed on the semiconductor substrate.

9. The semiconductor device according to claim 1, wherein the second via is made of a single metal.

10. The semiconductor device according to claim 9, wherein the second via is in direct contact with the first metal wiring.

11. The semiconductor device according to claim 9, wherein the second via and the first metal wiring are both part of a continuous metal film.

12. A method, comprising:
    forming an insulating layer on a substrate;
    forming a hole extending through the insulating layer;
    forming a metal film over the insulating layer to form a first via in the hole;
    forming a second via in an upper portion of the metal film; and
    etching the metal film and the second via to simultaneously form a first space and a second space reaching to the insulating layer,
    wherein a side surface of the second via is aligned with a side surface of at least one of the first or second spaces along a first direction, and
    wherein an upper surface of the first via includes a notch.

13. The method of claim 12, further comprising:
    forming an insulating layer over the etched metal film to form a metal wiring between the first and second spaces.

14. The method of claim 12, wherein the second via is made of a single metal.

15. A semiconductor device, comprising:
    a stack body having an electrode layer and an insulating layer that are alternately stacked;
    a first via provided on the stack body;
    a first metal wiring provided on the first via; and
    a second via provided on the first metal wiring,
    wherein a first side surface of the first metal wiring and a first side surface of the second via are aligned along a first direction, the first via is electrically connected to a memory element film penetrating a stacked body, and wherein an upper surface of the first via includes a notch.

16. The semiconductor device according to claim 15, wherein the second via is made of a single metal.

17. The semiconductor device according to claim 16, wherein the second via is in direct contact with the first metal wiring.

18. The semiconductor device according to claim 16, wherein the second via and the first metal wiring are both part of a continuous metal film.

* * * * *